United States Patent
Kirisawa

(10) Patent No.: US 6,555,870 B1
(45) Date of Patent: Apr. 29, 2003

(54) NONVOLATILE SEMICONDUCTOR MEMORY DEVICE AND METHOD FOR PRODUCING SAME

(75) Inventor: Ryouhei Kirisawa, Yokkaichi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 33 days.

(21) Appl. No.: 09/605,895

(22) Filed: Jun. 29, 2000

(30) Foreign Application Priority Data

Jun. 29, 1999 (JP) .......................................... 11-184356

(51) Int. Cl.[7] .......................................... H01L 29/792
(52) U.S. Cl. ........................................................ 257/324
(58) Field of Search ................................ 257/314–322; 438/257–365; 365/185

(56) References Cited

U.S. PATENT DOCUMENTS 5,338,953 A * 8/1994 Wake .......................... 257/316
5,554,550 A * 9/1996 Yang .......................... 438/257
5,621,683 A * 4/1997 Young .................... 365/185.01

FOREIGN PATENT DOCUMENTS

| JP | 4-155870 | 5/1992 |
| JP | 5-315622 | 11/1993 |
| JP | 410144810 A * | 5/1998 |

* cited by examiner

Primary Examiner—Cuong Quang Nguyen
(74) Attorney, Agent, or Firm—Oblon, Spivak, McClelland, Maier & Neustadt, P.C.

(57) ABSTRACT

A groove 11 is formed in a semiconductor substrate 10. A source region 12 is formed on the bottom of the groove 11 on the side of the surface of the semiconductor substrate 10. A drain region 14 is formed in a portion, in which the groove 11 is not formed, on the side of the surface of the semiconductor substrate 10. Floating gates 30 are formed on both inner side wall portions of the groove 11 as charge storage layers. By thus three-dimensionally forming a memory transistor, it is possible to achieve the high density integration of a nonvolatile semiconductor memory device.

6 Claims, 10 Drawing Sheets

| | BIT LINE 4(1) | BIT LINE 4(2) | WORD LINE 3(1) | WORD LINE 3(2) | WORD LINE 3(3) | SOURCE LINE 2(1) | SOURCE LINE 2(2) |
|---|---|---|---|---|---|---|---|
| ERASE | Open | Open | 0V | 12V | 12V | Open | 12V |
| WRITE | 6V | Open | 10V | 0V | 0V | 6V OR Open | 0V |
| READ | 3V | Open | 3V | 0V | 0V | 3V OR Open | 0V |

FIG. 8

NONVOLATILE SEMICONDUCTOR MEMORY DEVICE AND METHOD FOR PRODUCING SAME

RELATED APPLICATION

This application claims the benefit of priority under 35 U.S.C. §119 of Japanese Patent Application No. H11-184356, filed on Jun. 29, 1999, the entire contents of which are incorporated by reference herein.

BACKGROUND OF THE INVENTION

1. Field of the Invention

The present invention relates generally to a nonvolatile semiconductor memory device capable of electrically writing/erasing/reading out data and a method for producing the same. More specifically, the invention relates to a nonvolatile semiconductor memory device wherein memory cell transistors constitute a ground cell array, and a method for producing the same.

2. Description of the Related Background Art

FIGS. 14 and 15 show a conventional nonvolatile semiconductor memory device having a ground cell array structure. Of these figures, FIG. 14 is a perspective view three-dimensionally showing a nonvolatile semiconductor memory device, from which an interlayer dielectric film on word lines formed on a semiconductor substrate is removed. FIG. 15A is a plan view of the nonvolatile semiconductor device, and FIG. 15B is a sectional view taken along lines A—A of FIG. 15A.

As can be seen from FIG. 14, on the surface of a p-type semiconductor substrate 100 of this nonvolatile semiconductor memory device, element isolating regions 400 are formed by the LOCOS (Local Oxidation of Silicon) method. Between adjacent two of the element isolating regions 400, an element region 410 is formed. Below the element isolating regions 400, $n^+$-type drain regions 140 and $n^+$-type source regions 120 are formed. That is, the drain regions 140 and the source regions 120 are formed as impurity diffusion layers of the opposite conductive type to that of the semiconductor substrate 100.

The drain regions 140 and the source regions 120 are continuously connected to memory cells adjacent thereto in bit line direction. As can be seen from FIG. 15A, each of the drain regions 140 constitutes a bit line 141, and each of the source regions 120 constitutes a source line 121.

As can be seen from FIGS. 14 and 15B, a tunnel oxide film 200 having a thickness of about 100 angstroms is formed on the element regions 410, and floating gates 300 of a polycrystalline silicon are formed on the tunnel oxide film 200. On the floating gates 300, an insulating film 220 having a thickness of about 150 angstroms, which comprises three layers of an oxide film, a nitride film and an oxide film, is formed. On this insulating film 220, control gates 320 intersecting the bit lines 141 and the source lines 121 are formed. Each of the control gates 320 is made of a polycrystalline silicon similar to the floating gates 320. As can be seen from FIG. 15A, each of the control gates 320 constitutes a word line 131.

Then, the operation of this nonvolatile semiconductor memory device will be described. When data are written in a memory cell transistor of such a ground cell array, i.e., when electrons are injected into the floating gate 300, for example, a voltage of 6 V is applied to the bit line 141, a voltage of 10 V is applied to the word line 131, and the source line 121 is grounded. Thus, a channel current flows through the memory cell transistor, and a part thereof is injected into the floating gate 300 as hot electrons. After the electron injection, the threshold of the memory cell transistor is about 5 to 6 V.

When data are erased, for example, the bit line 141 is open, the word line 131 is grounded, and a voltage of 12 V is applied to the source line 121. Alternatively, the bit line 141 is open, a voltage of −9 V is applied to the word line 131, and a voltage of 3 V is applied to the source line 121. Thus, the electrons of the floating gate 300 are emitted to the source line 121 (the source region 120). After the emission of the electrons, the threshold of the memory cell transistor is about 0 to 2 V.

When data are read, for example, a voltage of 3 V is applied to the bit line 141 and the word line 131, and the source line 121 is grounded. Thus, the presence of current flowing through the source line 121 is caused to correspond to 1-bit information "0" or "1". That is, when data are written, the threshold of the memory cell transistor is about 5 to 6 V, and when data are erased, the threshold of the memory cell transistor is about 0 to 2 V. Therefore, for example, when a voltage of 3 V is applied to the word line 131, a case where current flows from the bit line 141 to the source line 121 is caused to correspond to "1", and a case where no current flows from the bit line 141 to the source line 121 is caused to correspond to "0".

As can be seen from FIGS. 14, 15A and 15B, there is conventionally a limit to the high ration since the floating gate 300 is two-dimensionally formed on the surface of the semiconductor substrate 100.

SUMMARY OF THE INVENTION

It is therefore an object of the present invention to eliminate the aforementioned problems and to achieve the high density integration of a nonvolatile semiconductor memory device by three-dimensionally arranging source lines, bit lines and charge storage layers. That is, it is an object of the present invention to provide a nonvolatile semiconductor memory device capable of being integrated with high density by forming grooves in a semiconductor substrate, forming source lines or bit lines on the bottoms of the grooves and other portions than the grooves, respectively, and forming charge storage layers on the inner side wall portions of the groove.

In order to accomplish the aforementioned and other objects, according to one aspect of the present invention, a nonvolatile semiconductor memory device comprising: a plurality of memory cell transistors which are arranged in column and row directions; and a semiconductor substrate of a first conductive type, in which a plurality of grooves are formed so as to extend in column direction on the side of the surface thereof, each of the memory cell transistors comprising:

a first region of a second conductive type formed in the surface portion of the semiconductor substrate on the bottom of each of the grooves;

a second region of the second conductive type formed in the surface portion of the semiconductor substrate other than the grooves;

a charge storage layer formed on the inner side wall portion of each of the grooves; and a conductive layer formed on the charge storage layer and the first and second regions via an insulating film.

According to another aspect of the present invention, a nonvolatile semiconductor memory device comprising: a plurality of memory cell transistors which are arranged in column and row directions; and a semiconductor substrate of a first conductive type, in which a plurality of grooves are formed so as to extend in column direction on the side of the surface thereof, each of the memory cell transistors comprising:

a first region of a second conductive type formed in the surface portion of the semiconductor substrate on the bottom of each of the grooves;

a second region of the second conductive type formed in the surface portion of the semiconductor substrate other than the grooves;

a charge storage layer formed on the semiconductor substrate; and a conductive layer formed on the charge storage layer.

According to one aspect of the present invention, a method for producing a nonvolatile semiconductor memory device having a plurality of memory cell transistors which are arranged in column and row directions, the method comprising the steps of:

forming grooves in the surface portion of a semiconductor substrate of a first conductive type so as to extend in column direction;

forming a first insulating film on the semiconductor substrate including the inner side wall portion of the grooves;

forming charge storage layers on the first insulating film on the inner side wall portions of the grooves;

forming first regions of a second conductive type in the surface portion of the semiconductor substrate on the bottom of the grooves so as to extend along the grooves;

forming second regions of the second conductive type in a portion other than the grooves on the side of the surface of the semiconductor substrate so as to extend along the groove;

forming a second insulating film so as to cover the first and second regions and the charge storage layers; and forming conductive layers on the second insulating film so as to extend in row direction.

According to another aspect of the present invention, a method for producing a nonvolatile semiconductor memory device having a plurality of memory cell transistors which are arranged in column and row directions, the method comprising the steps of:

forming grooves in the surface portion of a semiconductor substrate of a first conductive type so as to extend in column direction;

forming a first insulating film on the surface of the semiconductor substrate including the inner side wall portions of the grooves;

forming a second insulating film, which is an insulating film of a different kind from that of the first insulating film, on the first insulating film;

forming first regions of a second conductive type in the surface portion of the semiconductor substrate on the bottom of the grooves so as to extend along the grooves;

forming second regions of the second conductive type in the surface portion of the semiconductor substrate other than the grooves so as to extend along the grooves; and forming conductive layers on the second insulating film so as to extend in row direction.

BRIEF DESCRIPTION OF THE DRAWINGS

The present invention will be understood more fully from the detailed description given here below and from the accompanying drawings of the preferred embodiments of the invention. However, the drawings are not intended to imply limitation of the invention to a specific embodiment, but are for explanation and understanding only.

In the drawings:

FIG. 8 is a table showing operation conditions for the first and second preferred embodiments of a nonvolatile semiconductor memory device according to the present invention;

DESCRIPTION OF THE PREFERRED EMBODIMENTS

First Preferred Embodiment

According to the first preferred embodiment of the present invention, in a ground cell array type nonvolatile semiconductor memory device having a floating gate of a polycrystalline silicon, the bottom of a groove formed in a semiconductor substrate serves as a drain or source, and the floating gate is formed on the inner side wall of the groove, so that it is possible to achieve the high density integration of the device. Referring now to the accompanying drawings, this preferred embodiment will be described in detail below.

Figure 1A:
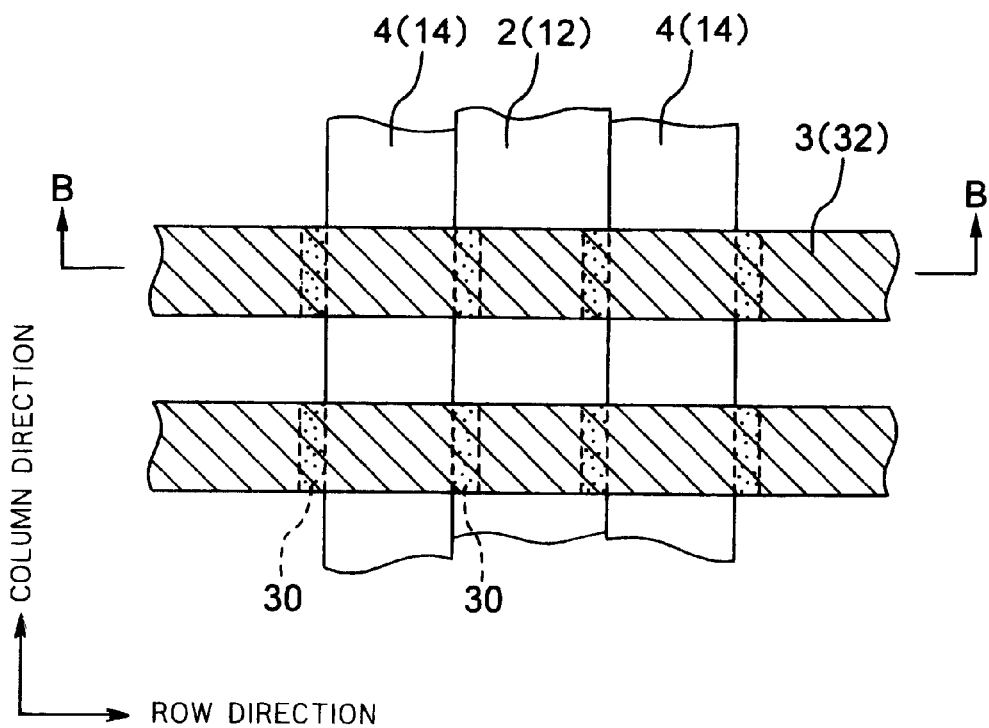
FIG. 1A is a plan view of the first preferred embodiment of a nonvolatile semiconductor memory device according to the present invention.
Figure 1B:
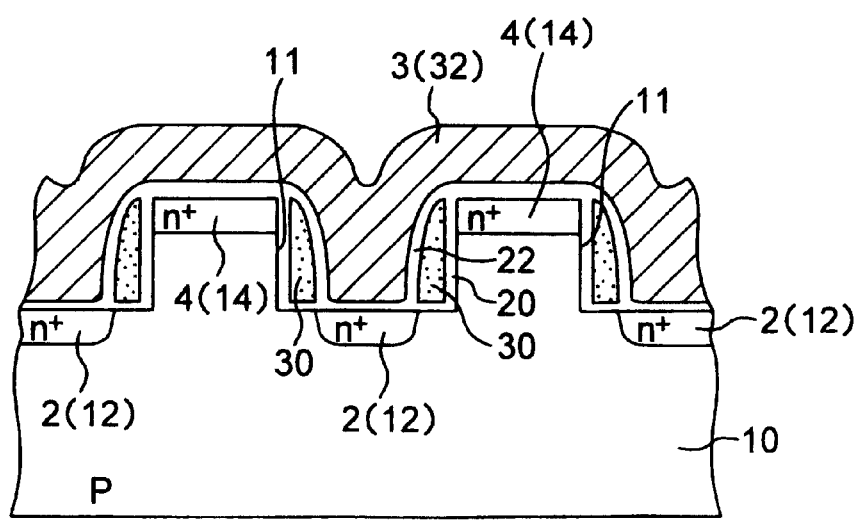
FIG. 1B is a sectional view of the first preferred embodiment of a nonvolatile semiconductor memory device according to the present invention.
Figure 2:
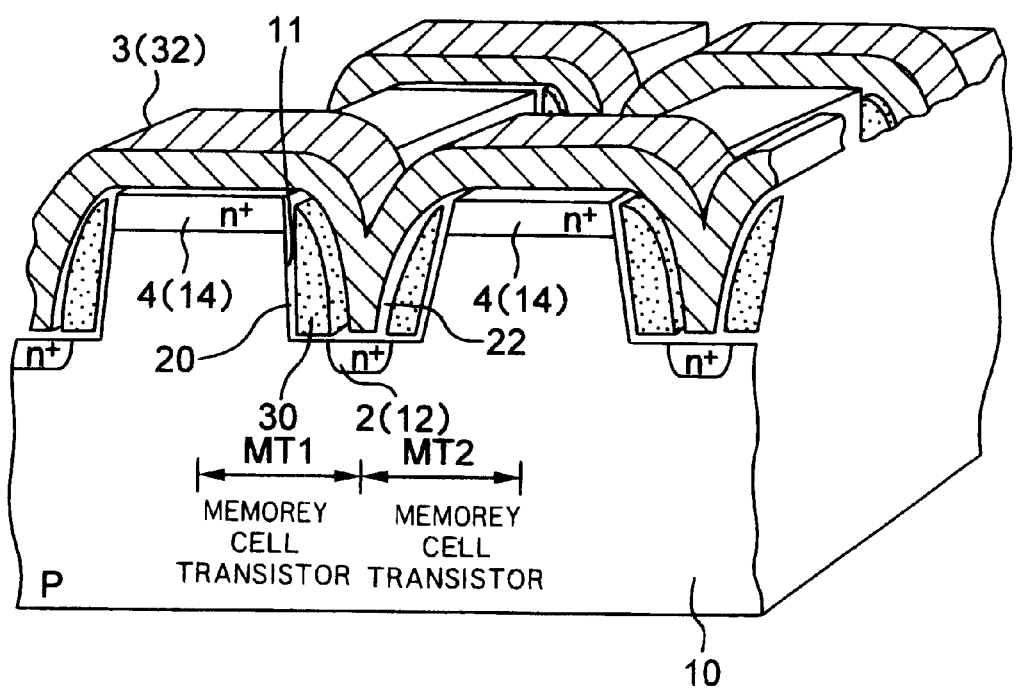
FIG. 2 is a perspective view of the first preferred embodiment of a nonvolatile semiconductor memory device according to the present invention.

First, referring to FIGS. 1A, 1B and 2, the structure of a nonvolatile semiconductor memory device in this preferred embodiment will be described. FIG. 1A is a plan view of the nonvolatile semiconductor memory device, which penetrates an interlayer dielectric film, and FIG. 1B is a sectional view taken along line B—B of FIG. 1A. FIG. 2 is a perspective view three-dimensionally showing a word line portion of the nonvolatile semiconductor memory device, from which an interlayer dielectric film is removed.

As can be seen from FIG. 1B, grooves 11 are formed in the surface portion of a semiconductor substrate 10 of a p-type silicon substrate. On the bottom of each of the grooves 11, in the surface portions of the semiconductor substrate 10, an $n^+$-type source region 12 is formed. That is, the source region 12 is formed as an impurity diffusion layer having the opposite conductive type to that of the semiconductor substrate 10.

In each of portions, in which the grooves 11 are not formed, in the surface portions of the semiconductor substrate 10, an $n^+$-type drain region 14 is formed. That is, in the upper surface portion of the semiconductor substrate 10, the drain region 14 is formed as an impurity diffusion layer having the opposite conductive type to that of the semiconductor substrate 10 similar to the source region 12. The source region 12 is continuously connected to a cell adjacent thereto in bit line direction (column direction) to form a source line 2. The drain region 14 is continuously connected to a cell adjacent thereto in bit line direction to form a bit line 4.

On the inner wall portion of each of the grooves 11, floating gates 30 of a polycrystalline silicon are formed via a tunnel oxide film 20. That is, the floating gates 30 are formed on both inner side wall portions of each of the grooves 11. Each of these floating gates 30 constitute a charge storage layer in this preferred embodiment.

On the top of the floating gates 30, a control gate 32 of a polycrystalline silicon is formed via an insulating film 22 of a laminated film (ONO) comprising an oxide film, a nitride film and an oxide film. The control gate 32 intersects the source lines 2 and the bit lines 4 to constitute a word line 3 continuously extending in row direction.

The memory cell transistor comprises the source line 2 formed on the bottom of the groove 11, the bit line 4 formed on the surface of the semiconductor substrate 10, the floating gate 30 on the side wall portion of the groove 11 formed therebetween, and the control gate 32.

Referring to FIGS. 3 through 6 and FIGS. 1A and 1B, a method for producing the first preferred embodiment of a nonvolatile semiconductor memory device according to the present invention will be described below. FIGS. 3 through 6 are sectional views showing the steps of a method for producing the first preferred embodiment of a nonvolatile semiconductor memory device according to the present invention.

Figure 3:
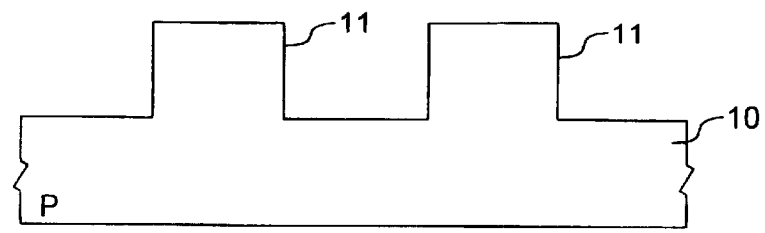
FIG. 3 is a schematic sectional view showing a part of a process for producing the first preferred embodiment of a nonvolatile semiconductor memory device according to the present invention.

As shown in FIG. 3, grooves 11 having a depth of, e.g., 2000 to 5000 angstroms, are formed in a semiconductor substrate 10 of a p-type silicon substrate by the RIE (Reactive Ion Etching).

Figure 4:
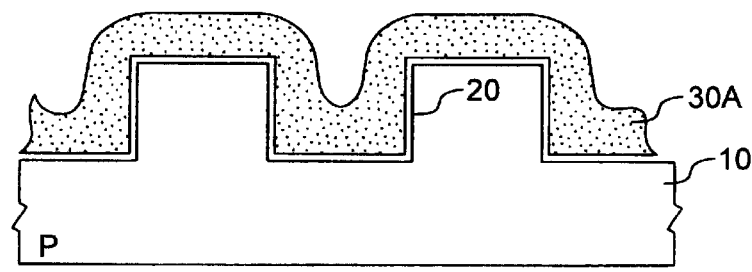
FIG. 4 is a schematic sectional view showing a part of a process for producing the first preferred embodiment of a nonvolatile semiconductor memory device according to the present invention.

Then, as shown in FIG. 4, a tunnel oxide film 20 having a thickness of, e.g., 80 to 100 angstroms, is formed. Subsequently, a polycrystalline silicon layer 30A having a thickness of, e.g., 1000 to 3000 angstroms, is deposited on the tunnel oxide film 20. In this polycrystalline silicon layer 30A, phosphorus may be doped as an impurity, or phosphorus or arsenic may be ion-implanted as an impurity. That is, the polycrystalline silicon layer 30A is formed of a conductive member.

Figure 5:
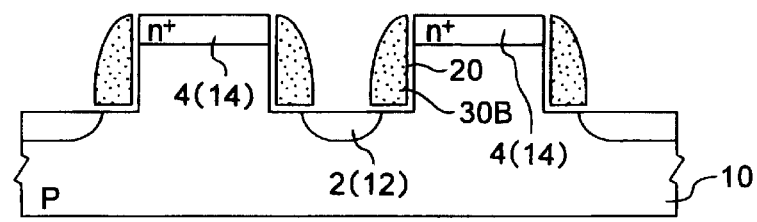
FIG. 5 is a schematic sectional view showing a part of a process for producing the first preferred embodiment of a nonvolatile semiconductor memory device according to the present invention.

Then, as shown in FIG. 5, the polycrystalline silicon layer 30A is etched by the RIE to form polycrystalline silicon layers 30B. That is, if the polycrystalline silicon layer 30A is etched by the RIE, the polycrystalline silicon layers on both inner side wall portions of the grooves 11 remain without being etched. The polycrystalline silicon layers remaining on the both inner side wall portions of the grooves 11 are the polycrystalline silicon layers 30B. That is, the polycrystalline silicon layers 30B are formed so as to be self-aligned. However, at this time, the polycrystalline silicon layers 30B are continuously formed along the grooves 11.

By ion-implanting the impurity of phosphorus or arsenic in this state, $n^+$-type diffusion layers are continuously formed on the bottom of each of the grooves 11 and on the side of the surface of the semiconductor substrate 10. These regions serve as a source region 12 and a drain region 14 of a memory transistor. That is, the source region 12 is formed on the bottom of each of the grooves 11 of the semiconductor substrate 10, and the drain region 14 is formed in the surface portions of the semiconductor substrate 10. Then, the source region 12 serves as a source line 2 continuously extending along the grooves 11, and the drain region 14 serves as a bit line 4 continuously extending along the grooves 11.

Figure 6:
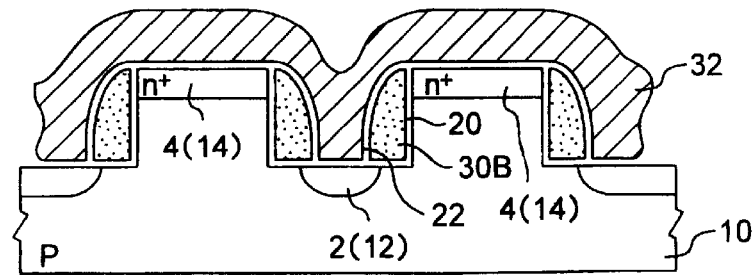
FIG. 6 is a schematic sectional view showing a part of a process for producing the first preferred embodiment of a nonvolatile semiconductor memory device according to the present invention.

Then, as shown in FIG. 6, an insulating film 22 of a laminated film (an ONO film) comprising a nitride film sandwiched between oxide films is formed thereon. This insulating film 22 has a thickness of, e.g., 120 to 180 angstroms. Subsequently, a polycrystalline silicon layer having a thickness of 2000 to 3000 angstroms is deposited on the insulating film 22 to form a polycrystalline silicon film 32.

Then, as shown in FIG. 1A, a photoresist is applied thereon, and the photoresist is patterned by the optical lithography so as to be perpendicular to the bit lines 4 and the source lines 2. Then, this photoresist is used as a mask to etch the polycrystalline silicon film 32 by the RIE to form word lines 3. Subsequently, the photoresist is used as a mask to etch the insulating film 22 and the polycrystalline silicon layers 30B by the RIE. Thus, the polycrystalline silicon layers 30B are separated from each other in bit line direction to form floating gates 30. That is, at this time, the floating gates 30 separated from each other every memory cell transistor are formed.

Furthermore, after the word lines 3 are formed, an insulating film is deposited thereon by the CVD (Chemical Vapor Deposition) to form interlayer dielectric films between aluminum (Al) wirings or the like and the word lines 3, although this is not shown.

In addition, around the memory cell array, contact holes for electrically connecting the bit lines 4, the source lines 2 and the aluminum (Al) wirings are formed at desired positions by the RIE. Thereafter, aluminum (Al) or the like is sputtered to be patterned to form a wiring.

Figure 7:
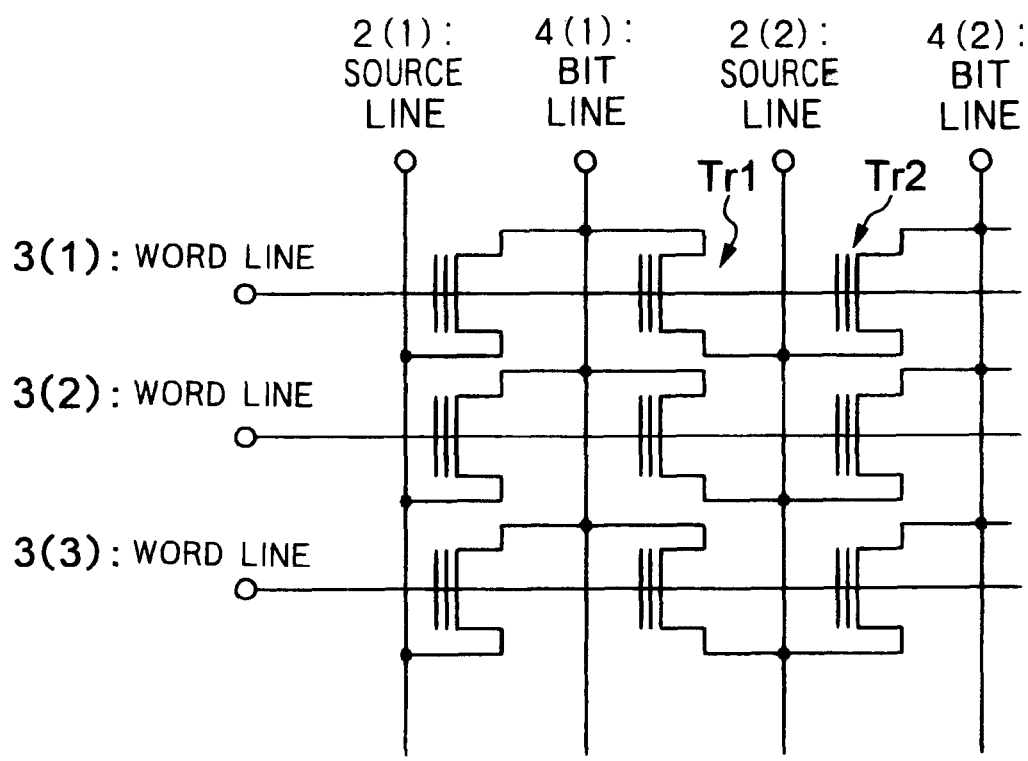
FIG. 7 is a circuit diagram showing an equivalent circuit of the first and second preferred embodiments of a nonvolatile semiconductor memory device according to the present invention.

Referring to FIGS. 7 and 8, the operation of the nonvolatile semiconductor memory device in this preferred embodiment will be described below. FIG. 7 shows an equivalent circuit for the nonvolatile semiconductor memory device shown in FIGS. 1 and 2, and FIG. 8 is a table showing its operation conditions.

As shown in FIGS. 7 and 8, when data are written in a selected memory cell transistor Tr1, i.e., electrons are injected into the floating gates 30 (see FIG. 2), for example, a voltage of 6 V is applied to a bit line 4(1), a bit line 4(2) is open, a voltage of 10 V is applied to a word line 3(1), and a source line 2(2) is grounded. Other word lines 3(2) and 3(3) are grounded. To other source line 2(1), a voltage of 6 V, which is the same potential as that of the bit line 4(1), or a higher potential than the ground potential, at which electrons are not injected into the floating gates 30 of the memory cell transistor by the back bias effect, is applied, or source line 2(1) is open.

Thus, a channel current flows through only the selected memory cell transistor Tr1, and a part thereof is injected into the floating gates 30 (see FIG. 2) as hot electrons. After the electron injection, the threshold of the memory cell transistor is about 5 to 6 V.

When data are erased every selected block having a certain size (memory transistors Tr1 and Tr2 in this case), for example, the bit lines 4(1) and 4(2) are open, the word line 3(1) is grounded, and a voltage of 12 V is applied to the source line 2(2). If a voltage of, e.g., 12 V, is applied to the word lines 3(2) and 3(3) of memory cell transistors which are not to be erased, and if the source line 2(1) is open, the memory cell transistors connected to the word lines 3(2) and 3(3) and the source line 2(1) are not erased.

Thus, electrons of the floating gates 30 (see FIG. 2) of the selected memory cell transistors Tr1 and Tr2 are emitted to the source line 2(2). After the electrons are emitted, the threshold of the memory cell transistors is about 0 to 2 V.

When data are read out of the selected memory cell transistor Tr1, for example, a voltage of 3 V is applied to the selected bit line 4(1) and word line 3(1), bit line 4(2) is open, and the source line 2(2) is grounded. The word lines 3(2) and 3(3) of unselected memory cell transistors are grounded. To the source line 2(1), a higher voltage (e.g., 3 V) than the ground potential, at which no current flows through the memory cell transistors by the back bias effect, is applied, or the source line 2(1) is open.

Thus, the presence of current flowing through the source line 2(2) connected to the selected memory cell transistor Tr1 is caused to correspond to 1-bit information "0" or "1". That is, when data are written, the threshold of the memory cell transistor is about 5 to 6 V, and when data are erased, the threshold of the memory cell transistor is about 0 to 2 V. Therefore, for example, when a voltage of 3 V is applied to the word line 3(1), a case where current flows from the bit line 4(1) to the source line 2(2) is caused to correspond to "1", and a case where no current flows from the bit line 4(1) to the source line 2(2) is caused to correspond to "0".

As described above, according to the nonvolatile semiconductor memory device in this preferred embodiment, the floating gates 30 are provided on both inner side wall portions of each of the grooves 11 formed in the semiconductor substrate. Therefore, it is possible to provide a nonvolatile semiconductor device which is integrated with higher density than those of conventional ground cell array type nonvolatile semiconductor devices wherein floating gates are formed on the same plane, so that it is possible to realize a large-capacity nonvolatile semiconductor device.

That is, the source region 12 is formed on the bottom of each of the grooves 11 of the semiconductor substrate 10, the drain region 14 is formed in the surface portions of the semiconductor substrate 10 between adjacent two of the grooves 11, and the floating gates 30 are formed on the side wall portions of each of the grooves 11, so that the whole area of the nonvolatile semiconductor memory device can be smaller than that when the floating gates are conventionally formed on the same plane. In other words, as shown in FIG. 2, two memory cell transistors MT1 and MT2 can be formed using one groove 11 of the semiconductor substrate 10, so that the nonvolatile semiconductor memory device can be scaled down.

In addition, since the depth of each of the grooves 11 is the channel length of the memory cell transistor, the depth of each of the grooves 11 only increases even if the channel length is increased in order to improve the electric resistance. Therefore, it is possible to prevent the plane area of the memory cell transistor from increasing even if the channel length is increased, so that it is possible to achieve the high density integration of the nonvolatile semiconductor memory device.

Second Preferred Embodiment

The second preferred embodiment of the present invention is applied to a memory cell transistor having a charge storage layer which is formed of a laminated insulating film comprising two or more layers, so that a nonvolatile semiconductor memory device can be integrated with higher density than that of a nonvolatile semiconductor having a charge storage layer of a polycrystalline silicon in the above described first preferred embodiment. Referring to the accompanying drawings, this preferred embodiment will be described in detail below.

Figure 9A:
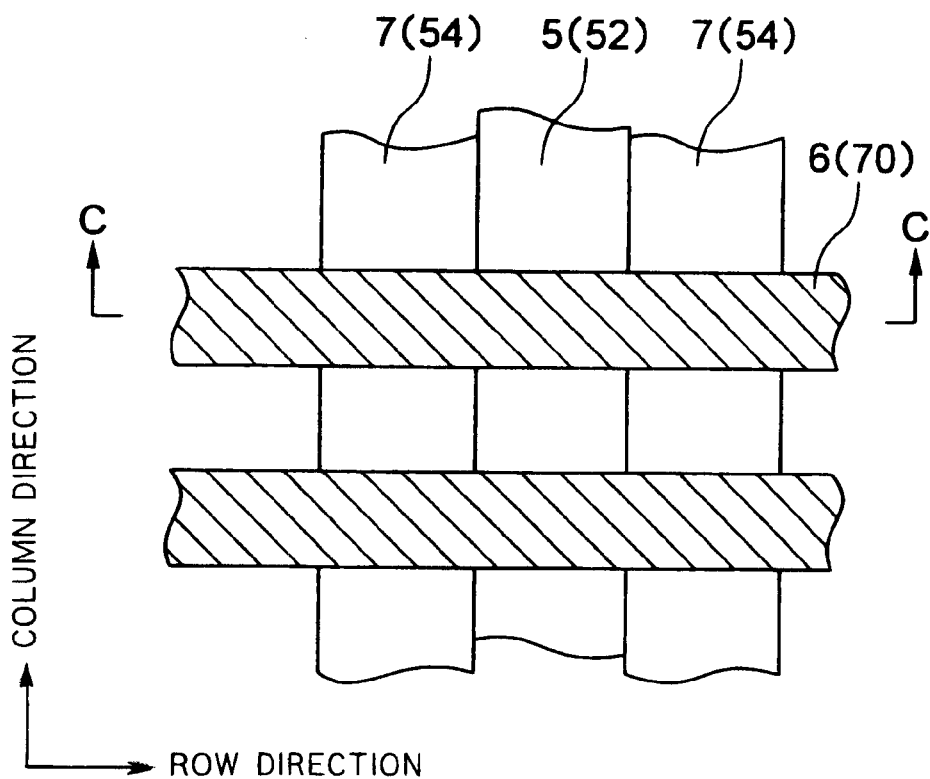
FIG. 9A is a plan view of the second preferred embodiment of a nonvolatile semiconductor memory device according to the present invention.
Figure 9B:
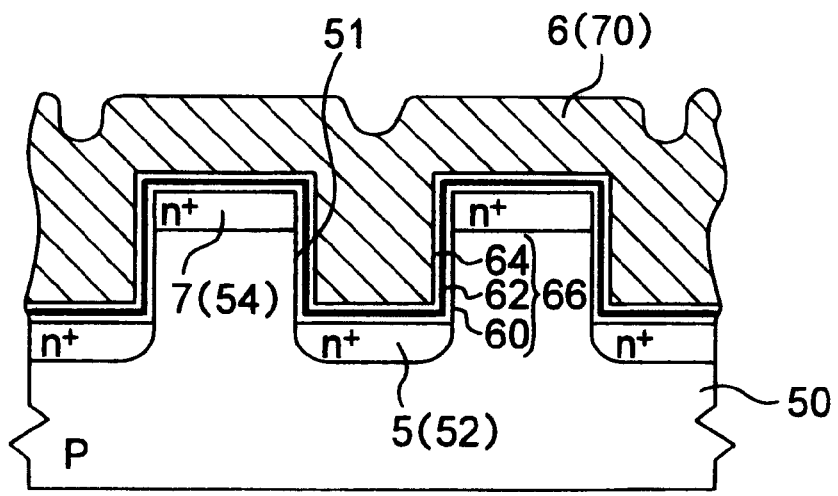
FIG. 9B is a sectional view of the second preferred embodiment of a nonvolatile semiconductor memory device according to the present invention.
Figure 10:
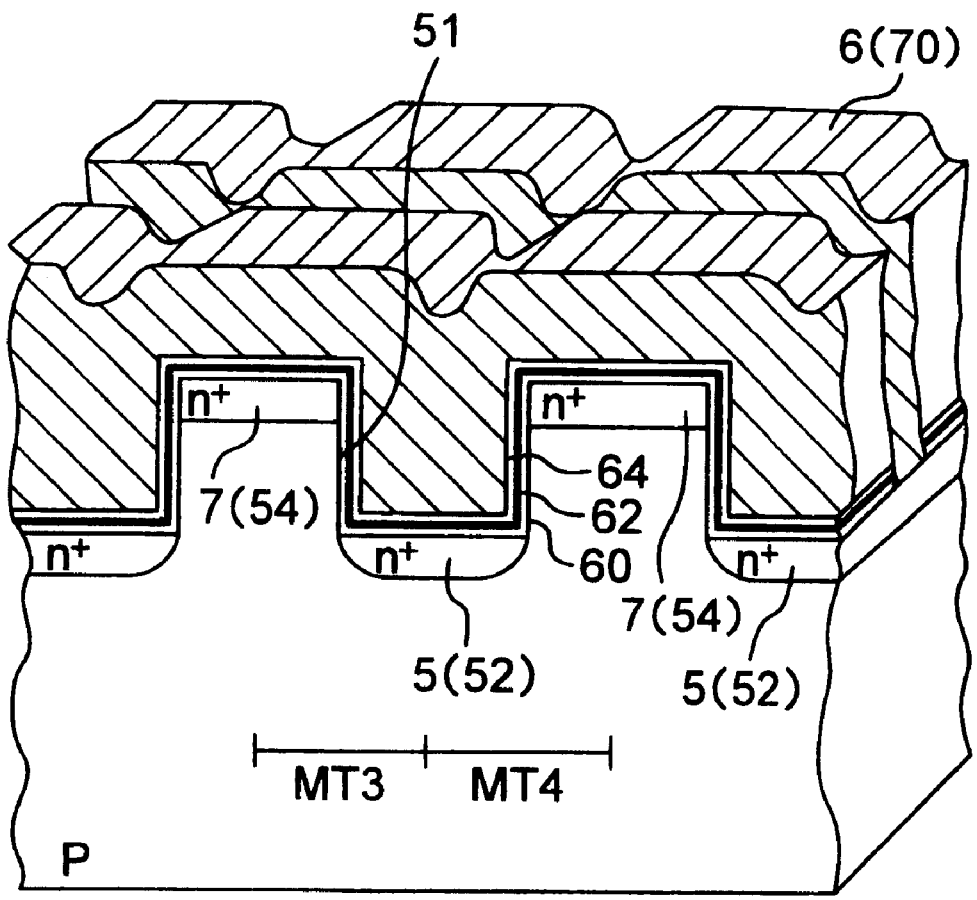
FIG. 10 is a perspective view of the second preferred embodiment of a nonvolatile semiconductor memory device according to the present invention.

First, referring to FIGS. 9A, 9B and 10, the structure of the second preferred embodiment of a nonvolatile semiconductor memory device according to the present invention will be described. FIG. 9A is a plan view of the second preferred embodiment of a nonvolatile semiconductor memory device according to the present invention, which penetrates an interlayer dielectric film, and FIG. 9B is a sectional view taken along line C—C of FIG. 9A. FIG. 10 is a perspective view three-dimensionally showing a word line portion of the nonvolatile semiconductor memory device, from which an interlayer dielectric film is removed.

As can be seen from FIG. 9B, grooves 51 are formed on the side of the surface of a semiconductor substrate 50 of a p-type silicon substrate. On the bottom of each of the grooves 51, an $n^+$-type source region 52 is formed. That is, the source region 52 is formed as an impurity diffusion layer having the opposite conductive type to that of the semiconductor substrate 50.

In each of portions, in which the grooves 51 are not formed, in the surface portion of the semiconductor substrate 50, an $n^+$-type drain region 54 is formed. That is, in the upper surface portion of the semiconductor substrate 50, each of the drain regions 54 is formed as an impurity diffusion layer having the opposite conductive type to that of the semiconductor substrate 50 similar to the source region 52. The source region 52 is continuously connected to a cell adjacent thereto in bit line direction(column direction) to form a source line 5. The drain region 54 is continuously connected to a cell adjacent thereto in bit line direction to form a bit line 7.

On the inner wall portion of each of the grooves 51, a charge storage layer 66 of a laminated layer comprising a lower oxide film 60, a nitride film 62 and an upper oxide film 63 is formed. Such a charge storage layer 66 can store electrons in the interfaces between the oxide films 60, 64 and the nitride film 62 or in the nitride film 62. On the top of the charge storage layer 66, a control gate 70 of a polycrystalline silicon layer is formed. This control gate 70 is connected to a cell adjacent thereto in row direction to form a word line 6. This word line 6 intersects the bit lines 7 and the source lines 5.

The memory cell transistor comprises the source line 5 formed on the bottom of each of the grooves 51, the bit line 4 formed on the surface of the semiconductor substrate 50, the charge storage layer 66, and the control gate 70.

Figure 11:
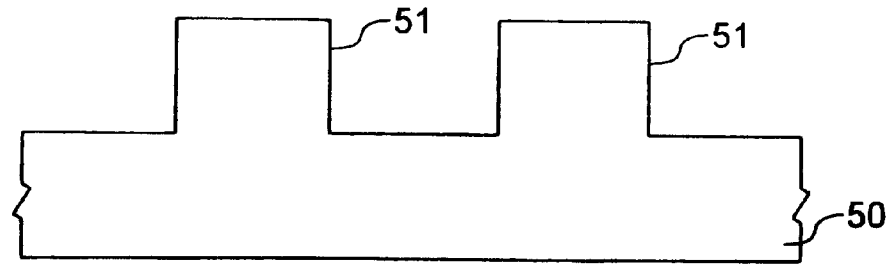
FIG. 11 is a schematic sectional view showing a part of a process for producing the second preferred embodiment of a nonvolatile semiconductor memory device according to the present invention.
Figure 12:
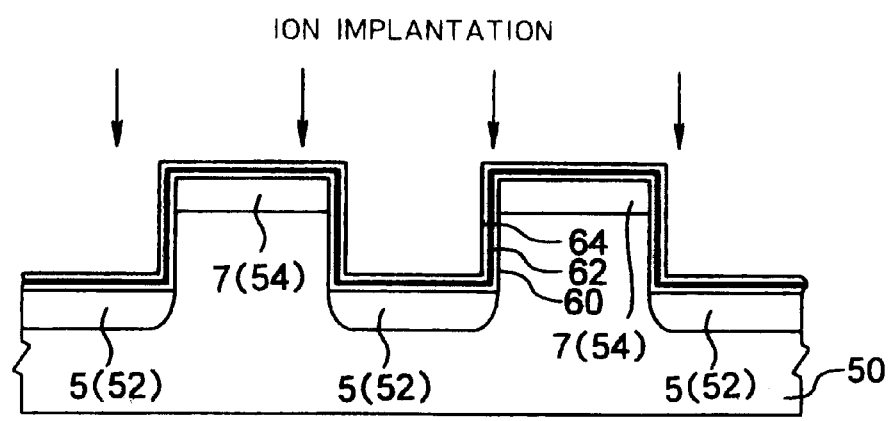
FIG. 12 is a schematic sectional view showing a part of a process for producing the second preferred embodiment of a nonvolatile semiconductor memory device according to the present invention.
Figure 13:
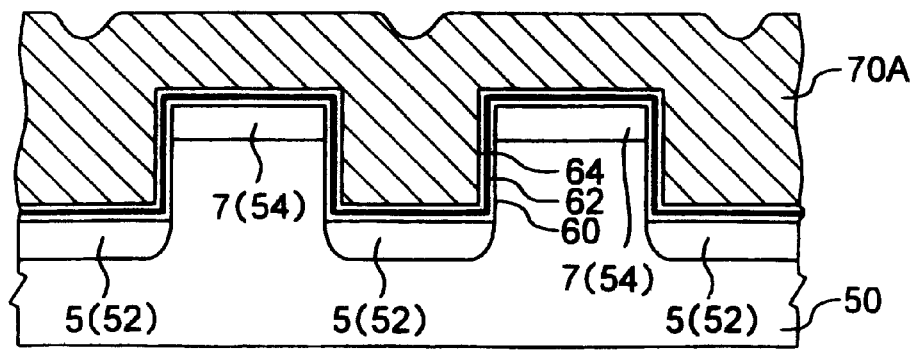
FIG. 13 is a schematic sectional view showing a part of a process for producing the second preferred embodiment of a nonvolatile semiconductor memory device according to the present invention.
Figure 14:
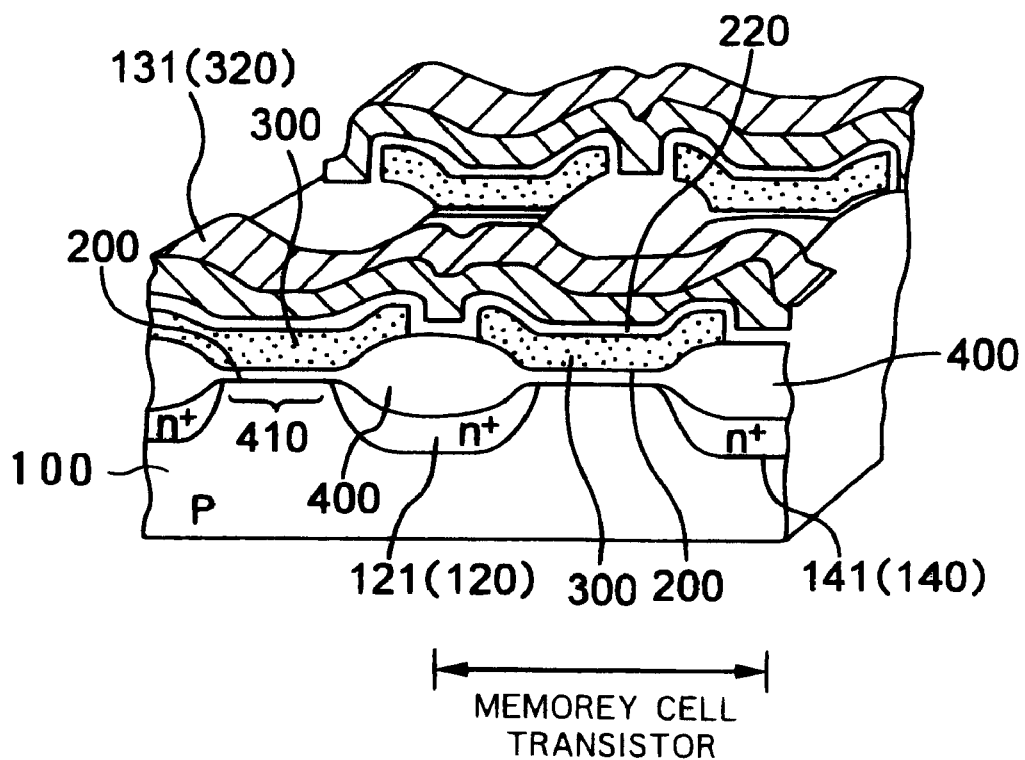
FIG. 14 is a perspective view of a conventional nonvolatile semiconductor memory device.
Figure 15A:
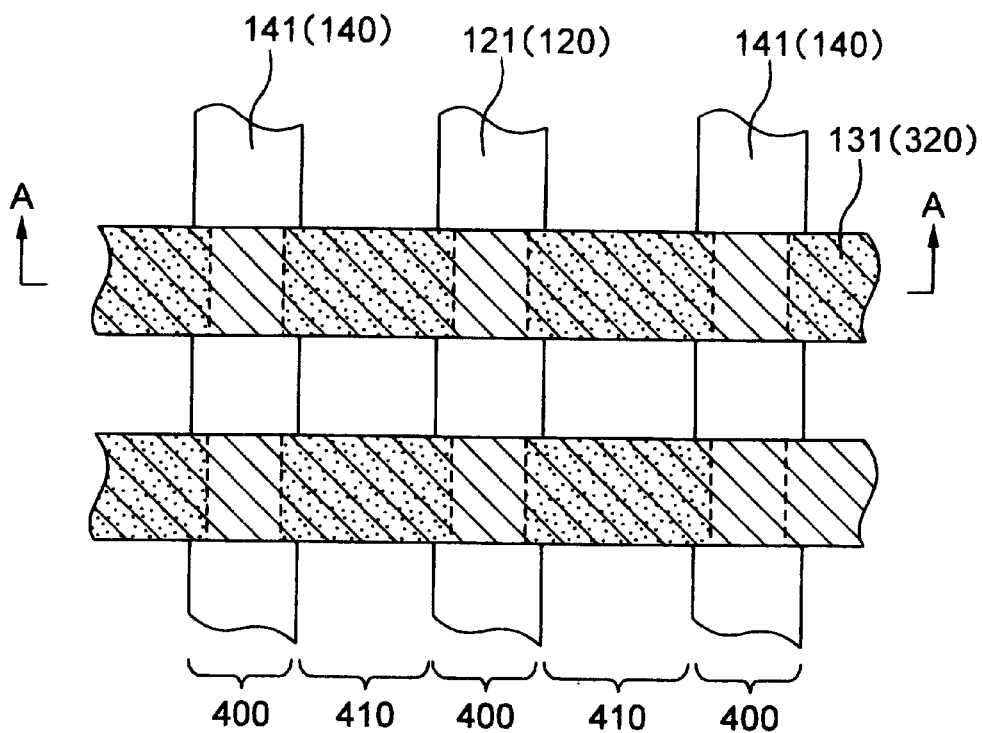
FIG. 15A is a plan view of a conventional nonvolatile semiconductor memory device.
Figure 15B:
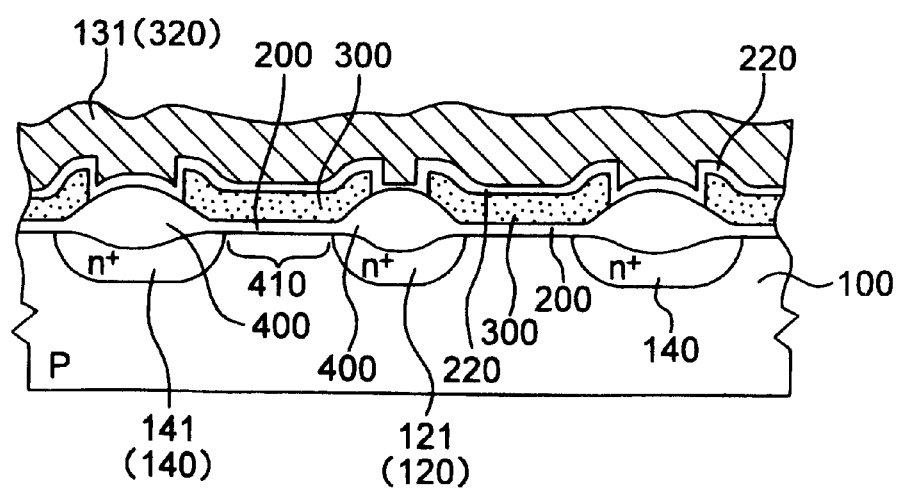
FIG. 15B is a sectional view of a conventional nonvolatile semiconductor memory device.

Referring to FIGS. 11 through 13 and FIG. 9, a method for producing the second preferred embodiment of a nonvolatile semiconductor memory device according to the present invention will be described below. FIGS. 11 through 13 are sectional views showing the steps of a method for producing the second preferred embodiment of a nonvolatile semiconductor memory device according to the present invention.

As shown in FIG. 11, grooves 51 having a depth of, e.g., 2000 to 5000 angstroms, are formed in the surface portion of a semiconductor substrate 50 of a p-type silicon substrate by the RIE.

Then, as shown in FIG. 12, after a lower oxide film 60 having a thickness of, e.g., 30 to 100 angstroms, is formed, a nitride film 62 having a thickness of, e.g., 80 to 150 angstroms, is deposited on the top of the lower oxide film 60 by the CVD. Thereafter, an upper oxide film 64 having a thickness of, e.g., 20 to 100 angstroms, is deposited on the top of the nitride film 62. The laminated film comprising the lower oxide film 60, the nitride film 62 and the upper oxide film 64 serves as the charge storage layer 66.

Then, an impurity of phosphorus and/or arsenic and the like is ion-implanted into the surface of the semiconductor substrate 50 to form source regions 52 and drain regions 54. At this time, if the incident angle on the bottom of each of the grooves 51 is always set to be 90 degrees to carry out the ion implantation, $n^+$-type diffusion layers are formed on the bottom of each of the grooves 51 on the side of the surface of the semiconductor substrate 50 and in other portions than the grooves 51 on the side of the surface of the semiconductor substrate 50 so that the ion implantation is hardly carried out into the side wall portions of the grooves 51. The $n^+$-type diffusion layers serve as source regions 52 and drain regions 54. As shown in FIG. 9A, the source regions 52 continuously extending along the grooves 51 serve as the source lines 5, and the drain regions 54 continuously extending the grooves 51 serve as the bit lines 7.

Then, as shown in FIG. 13, a polycrystalline silicon layer having a thickness of 2000 to 3000 angstroms is deposited on the top of the upper oxide film 64 to form a polycrystalline silicon layer 70A. This polycrystalline silicon layer 70A may have conductivity by doping phosphorus or the like to deposit the layer 70A, or by ion-implanting phosphorus or arsenic.

Then, as shown in FIG. 9, a photoresist is applied thereon, and the photoresist is patterned so as to be perpendicular to the bit lines 7 and the source lines 5. Then, this photoresist is used as a mask to etch the polycrystalline silicon layer 70A by the RIE to form control gates 70. Each of the control gates 70 is continuously connected to an adjacent memory cell transistor to form a word line 6. In addition, the photoresist is used as a mask to etch the upper oxide film 64, the nitride film 62 and the lower oxide film 60 by the RIE. Thus, as shown in FIG. 10, the charge storage layers 66, each of which comprises the upper oxide film 64, the nitride film 62 and the lower oxide film 60, are separated from each other in the direction of the grooves 51.

Furthermore, after the word lines 6 are formed, an insulating film is deposited thereon by the CVD to form interlayer dielectric films between aluminum (Al) wirings or the like and the word lines 6, although this is not shown.

In addition, around the memory cell array, contact holes for electrically connecting the bit lines 7, the source lines 5 and the aluminum (Al) wirings are formed at desired positions by the RIE. Thereafter, aluminum (Al) or the like is sputtered to be patterned to form a wiring.

Furthermore, the equivalent circuit and operation of the nonvolatile semiconductor memory device in this preferred embodiment are the same as those in the above described first preferred embodiment, so that the detailed descriptions thereof are omitted.

As described above, according to the nonvolatile semiconductor memory device in this preferred embodiment, the charge storage layers 66 are provided on the inner side wall portions of the grooves 51 formed in the semiconductor substrate 50. Therefore, it is possible to provide a nonvolatile semiconductor device which is integrated with higher density than those of conventional ground cell array type nonvolatile semiconductor devices wherein charge storage layers are formed on the same plane, so that it is possible to realize a large-capacity nonvolatile semiconductor device.

That is, the source region 52 is formed on the bottom of each of the grooves 51 of the semiconductor substrate 50, the drain region 54 is formed in the surface portions of the semiconductor substrate 50 between adjacent two of the grooves 51, and the laminated layers, each of which comprises the lower oxide film 60, the nitride film 62 and the upper oxide film 64 and which are arranged on the inner side wall portions of the grooves 51, are used as the charge storage layers 66, so that the whole area of the nonvolatile semiconductor memory device can be smaller than that when the charge storage layers are conventionally formed on the same plane. In other words, as shown in FIG. 10, two memory cell transistors MT3 and MT4 can be formed in one groove 51 of the semiconductor substrate 50, so that the nonvolatile semiconductor memory device can be scaled down.

In addition, since the depth of each of the grooves 51 is the channel length of the memory cell transistor, the depth of each of the grooves 51 only increases even if the channel length is increased in order to improve the electric resistance. Therefore, it is possible to prevent the plane area of the memory cell transistor from increasing even if the channel length is increased, so that it is possible to achieve the high density integration of the nonvolatile semiconductor memory device.

Moreover, since the laminated film comprising the lower oxide film 60, the nitride film 62 and the upper oxide film 64 is used as the charge storage layer 66, the thickness of the charge storage layer can be reduced by forming a floating gate of a polycrystalline silicon similar to the above described first preferred embodiment. Therefore, it is possible to further decrease the width of each of the grooves 51, so that it is possible to achieve the higher density integration of the nonvolatile semiconductor memory device.

Furthermore, the present invention should not be limited to the above described preferred embodiments, but the invention can be modified in various ways. For example, while the source regions 12, 52 have been formed on the bottoms of the grooves 11, 51 and the drain regions 14, 54 have been formed on the side of the surface of the semiconductor substrate 10, 50 between the grooves 11, 51 in the above described first and second preferred embodiments, both may be reversed. That is, the drain regions may be formed on the bottoms of the grooves 11, 51, and the source regions may be formed on the side of the surface of the semiconductor substrate 10, 50 between the grooves 11, 51.

In addition, while the laminated film of the three insulating films comprising the lower oxide film 60, the nitride film 62 and the upper oxide film 64 has been used as the charge storage layer 66 in the above described second preferred embodiment, the charge storage layer may be formed of a laminated layer of two or more insulating films of two or more kinds. Moreover, while the oxide and nitride films have been used as the two or more kinds of insulating films in the above described second preferred embodiment, the present invention should not be limited thereto. For example, an oxide film may be combined with a polysilicon, in which no impurity is doped.

In addition, while the voltage has been applied to the source lines 2, 5 when erasing data from the memory cell transistor in the first and second preferred embodiment, a method for applying a voltage to the semiconductor substrate 10, 50 may be applied. In such a method for applying the voltage to the semiconductor substrate 10, 50 to erase data, it is required to separate peripheral circuits for driving the ground cell array from the memory cell transistor forming region. Therefore, if the memory cell transistor is formed in a well region separated from the peripheral circuits in the semiconductor substrate 10, 50, it is possible to apply a voltage to only the memory cell transistor forming region.

For example, when a p-type semiconductor substrate 10, 50 is used, an n-type well is formed, and a p-type well is formed therein to form a memory cell transistor in the p-type well. On the other hand, when an n-type semiconductor substrate 10, 50 is used, a p-type well, in which a memory cell transistor forming region is separated from a peripheral circuit region, is formed. Thus, it is possible to apply a voltage to only the memory cell transistor forming region.

With respect to the voltage applied during erase, in the former, the p-type semiconductor substrate 10, 50 is grounded, and a high voltage, e.g., 15 to 20 V, is applied to the n-type well and the p-type well. In the latter, a high voltage, e.g., 15 to 20 V, is applied to the p-type well region, in which the n-type semiconductor substrate 10, 50 and the memory cell array are formed, and the p-type well for the peripheral circuits is grounded. In this way, it is possible to erase data. In either case, the conductive types of the semiconductor substrate 10, 50 and the wells may be reversed. In that case, the polarities of erase voltages are reversed.

Also in these cases, a voltage equal to the voltage applied to the well regions during erase is applied to the control gate of the memory cell transistor in a block, which is not to be erased, having a certain size. Alternatively, the above described well regions maybe divided into blocks having a certain size. In this case, blocks, which are not to be erased, are grounded.

As described above, in the nonvolatile semiconductor memory device and the method for producing the same according to the present invention, the charge storage layer is formed on the inner side wall portion of the groove formed in the semiconductor substrate, so that it is possible to realize the high density integration of a nonvolatile semiconductor memory device.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A nonvolatile semiconductor memory device comprising:
   a plurality of memory cell transistors which are arranged in column and row directions; and
   a semiconductor substrate of a first conductive type, in which a plurality of grooves are formed so as to extend in column direction on the side of the surface thereof,
   each of said memory cell transistors comprising,
      a first region of a second conductive type formed in the surface portion of the semiconductor substrate on the bottom of each of said grooves,
      a second region of said second conductive type formed in the surface portion of the semiconductor substrate other than said grooves,
      a charge storage layer formed on the semiconductor substrate, and
      a conductive layer formed on said charge storage layer;
      wherein said second region is shared between two of said memory cell transistors adjacent to each other in said row direction,
      said charge storage layer is continuously formed in said row direction for said memory cell transistors in said row direction,
      when electrons are injected into said charge storage layer of a selected one of said memory cell transistors, a first voltage is applied to said first region of said selected memory cell transistor, a second voltage is applied to said second region of said selected memory cell transistor, and a third voltage is applied to said first region of a second memory cell transistor which shares its second region with said selected memory cell transistor, and
      said second voltage is higher than said first voltage and said third voltage has a value such that electrons are not injected into said charge storage layer of said second memory cell transistor.

2. A nonvolatile semiconductor memory device as set forth in claim 1, wherein said charge storage layer comprises a laminated film having two or more kinds of insulating films.

3. A nonvolatile semiconductor memory device as set forth in claim 1, wherein said first and second regions are formed so as to extend along said grooves, and said plurality of memory cell transistors share said first and second regions to form a ground cell array type memory cell array.

4. A nonvolatile semiconductor memory device as set forth in claim 3, wherein said first region constitutes one of a source line and a drain line,
   said second region constitutes the other of said source line and said drain line, and
   said conductive layer is formed so as to continuously extend in said row direction to constitute a word line.

5. A nonvolatile semiconductor memory device as set forth in claim 1, wherein said third voltage is the same as said second voltage.

6. A nonvolatile semiconductor memory device comprising:
- a plurality of memory cell transistors which are arranged in column and row directions; and a semiconductor substrate of a first conductive type, in which a plurality of grooves are formed so as to extend in column direction on the side of the surface thereof,
- each of said memory cell transistors comprising,
  - a first region of a second conductive type formed in the surface portion of the semiconductor substrate on the bottom of each of said grooves,
  - a second region of said second conductive type formed in the surface portion of the semiconductor substrate other than said grooves,
  - a charge storage layer formed on the semiconductor substrate, and
  - a conductive layer formed on said charge storage layer;
- wherein said second region is shared between two of said memory cell transistors adjacent to each other in said row direction,
- said charge storage layer is continuously formed in said row direction for said memory cell transistors in said row direction, and
- when electrons are injected into said charge storage layer of a selected one of said memory cell transistors, said first region of a second memory cell transistor, which shares its second region with said selected memory cell transistor, is open.

* * * * *